(12) United States Patent
Watanabe et al.

(10) Patent No.: US 9,161,432 B2
(45) Date of Patent: Oct. 13, 2015

(54) CIRCUIT BOARD

(75) Inventors: Toshio Watanabe, Kanagawa (JP); Isao Ichimura, Tokyo (JP); Tatsuo Maeda, Kanagawa (JP); Takuma Nagata, Aichi (JP)

(73) Assignee: Sony Corporation, Tokyo (JP)

( * ) Notice: Subject to any disclaimer, the term of this patent is extended or adjusted under 35 U.S.C. 154(b) by 261 days.

(21) Appl. No.: 13/598,269

(22) Filed: Aug. 29, 2012

(65) Prior Publication Data

US 2013/0062717 A1 Mar. 14, 2013

(30) Foreign Application Priority Data

Sep. 9, 2011 (JP) .................. 2011-196819

(51) Int. Cl.
*H05K 7/20* (2006.01)
*H05K 1/02* (2006.01)
*H05K 3/00* (2006.01)
*H05K 3/30* (2006.01)

(52) U.S. Cl.
CPC ............ *H05K 1/0201* (2013.01); *H05K 3/0061* (2013.01); *H05K 3/303* (2013.01); *H05K 2201/09054* (2013.01); *H05K 2201/09063* (2013.01); *H05K 2201/09072* (2013.01); *H05K 2201/10121* (2013.01); *H05K 2201/10219* (2013.01); *H05K 2201/10409* (2013.01); *H05K 2203/165* (2013.01)

(58) Field of Classification Search
USPC ................... 361/676–678, 679.46–679.54, 361/688–722, 752, 760, 831
See application file for complete search history.

(56) References Cited

U.S. PATENT DOCUMENTS

| | | | | |
|---|---|---|---|---|
| 6,791,838 | B1 * | 9/2004 | Hung et al. ................... | 361/704 |
| 7,151,670 | B2 * | 12/2006 | Rogers et al. ................. | 361/709 |
| 7,864,531 | B2 * | 1/2011 | Kato et al. .................... | 361/707 |
| 7,969,741 | B2 * | 6/2011 | Hayakawa et al. ........... | 361/708 |
| 8,737,073 | B2 * | 5/2014 | Yeh et al. ...................... | 361/709 |
| 8,743,547 | B2 * | 6/2014 | Kim ............................... | 361/715 |
| 2003/0107874 | A1 * | 6/2003 | Feigenbaum et al. ........ | 361/704 |
| 2009/0135564 | A1 * | 5/2009 | Chen et al. .................... | 361/709 |
| 2010/0072510 | A1 * | 3/2010 | Lin et al. ......................... | 257/99 |
| 2011/0157446 | A1 * | 6/2011 | Kasai et al. .................... | 348/308 |

FOREIGN PATENT DOCUMENTS

JP 06-233311 8/1994

* cited by examiner

*Primary Examiner* — Courtney Smith
(74) *Attorney, Agent, or Firm* — Michael Best & Friedrich LLP

(57) ABSTRACT

A circuit board includes a board having a hole formed therein, and an imager that is bonded to a first region including at least a portion of the hole in a front surface of the board.

13 Claims, 9 Drawing Sheets

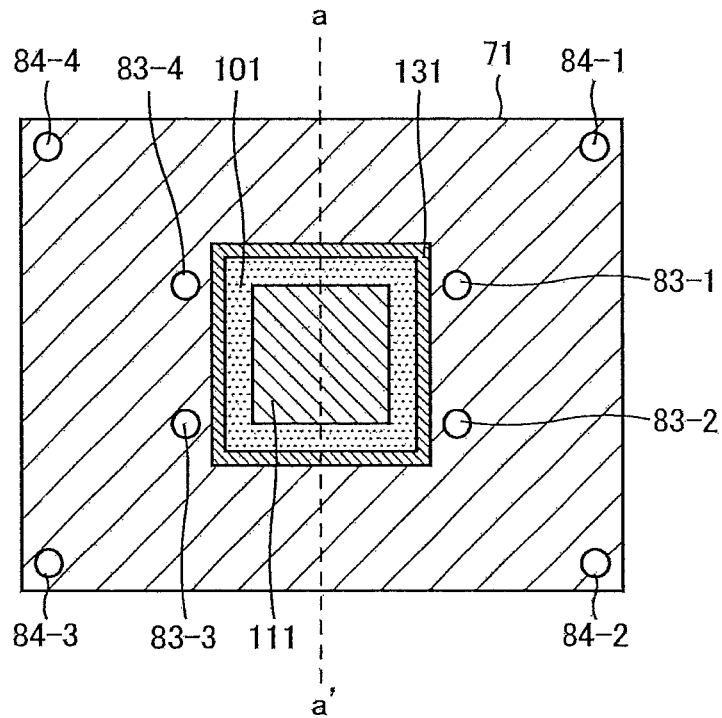
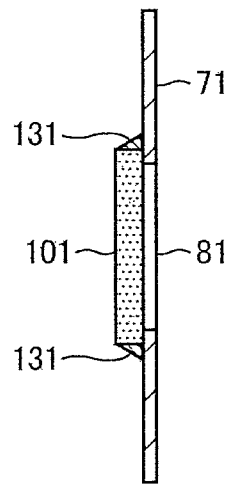

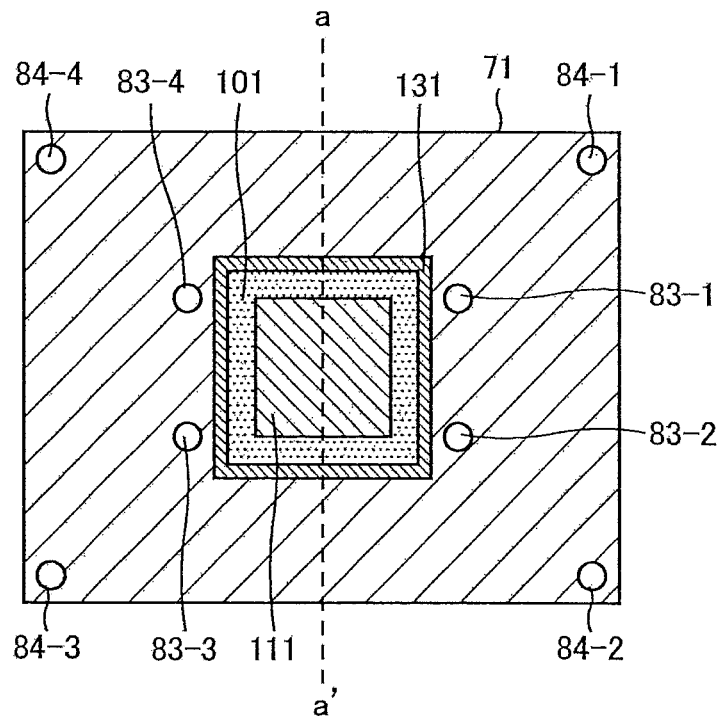
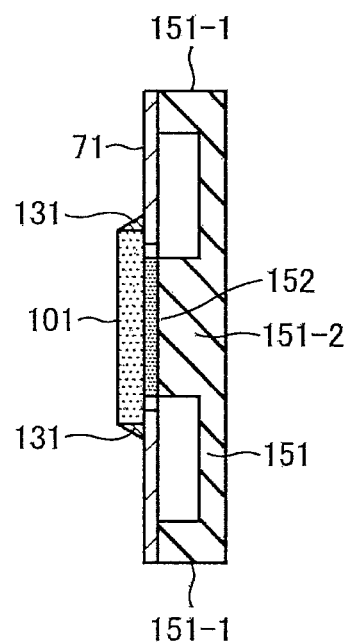

CIRCUIT BOARD

BACKGROUND

The present technology relates to a circuit board which mounts an imager, and more particularly, to a circuit board which has a compact structure without blocking a light receiving surface of the imager and is capable of efficiently regulating a temperature of the imager.

From the past, dark current noise is a target to be suppressed for an imager which detects very weak signals. The dark current noise arises because of electric charges generated by heat. Therefore, it is contemplated that the temperature of the imager is regulated constantly as one of measures to suppress the dark current noise. Moreover, in a case of evaluating characteristics of the imager, evaluation conditions need to be constant. Even in this point, it is desirable that the temperature of the imager be regulated constantly.

Thus, it is important to regulate the temperature of the imager constantly and as techniques according to the related art for regulating the temperature of the imager constantly, the following three techniques are well-known.

A first technique is a technique for constantly regulating the temperature of the imager indirectly (hereinafter, referred to as an indirect temperature regulation technique) by bringing a temperature regulation member such as a heat sink and a Peltier element into contact with a circuit board to which the imager is mounted (see, for example, Japanese Patent Application Laid-Open No. 6-233311). A second technique is a technique for constantly regulating the temperature of the imager (hereinafter, referred to as a thermostatic bath temperature regulation technique) by installing an entire circuit board to which the imager is mounted in a thermostatic bath. A third technique is a technique for constantly regulating the temperature of the imager (hereinafter, referred to as an air supply temperature regulation technique) by supplying air to the entire circuit board to which the imager is mounted.

SUMMARY

However, in the indirect temperature regulation technique such as Japanese Patent Application Laid-Open No. 6-233311, it is difficult to efficiently regulate the temperature of the imager because temperature regulation is targeted to the circuit board with which the temperature regulation member is directly brought into contact and the temperature of the imager is regulated through this circuit board. Therefore, there is a demand for regulating the temperature efficiently. Moreover, the thermostatic bath temperature regulation technique has a problem of a complex structure at the time of using the thermostatic bath. Therefore, there is a desire to compact the size. Moreover, in the air supply temperature regulation technique, it may be necessary to install an air source such as a fan at a position for blocking light to a light receiving surface of the imager for preventing temperature unevenness by evenly blowing air to the imager. However, when the light to the light receiving surface is blocked, the imager itself does not function any longer. Accordingly, in the past, the air is obliquely blown to the imager so as not to block the light to the light receiving surface, but temperature unevenness occurs in the imager and it is extremely difficult to regulate the temperature of the entire imager constantly. Therefore, there is a desire to regulate the temperature of the entire imager constantly by bringing the imager into contact with air evenly in a state where the light to the light receiving surface is not blocked.

In summary, as a technique of constantly regulating the temperature of the imager mounted on the circuit board, it has been demanded a technique which has a compact structure without blocking the light receiving surface of the imager and is capable of efficiently regulating the temperature of the imager.

The present technology has been made in view of the above-described circumstances so as to make it possible to provide a circuit board which has a compact structure without blocking the light receiving surface of the imager and is capable of efficiently regulating the temperature of the imager in the circuit board which mounts the imager.

According to an embodiment of the present technology, there is provided a circuit board including: a board having a hole formed therein; and an imager that is bonded to a first region including at least a portion of the hole in a front surface of the board.

The circuit board may further include a first temperature regulation member; and a second temperature regulation member, in which one of the first temperature regulation member and the second temperature regulation member is mounted in a second region including at least a portion of the hole in a rear surface of the board.

The circuit board may further include a third temperature regulation member inserted between a rear surface of the imager and one of the first temperature regulation member and the second temperature regulation member.

The third temperature regulation member may include an elastic thermal conductor sheet.

The third temperature regulation member may include thermal-conduction grease.

The first temperature regulation member may be a heat sink including an insertion hole configured to insert a temperature sensor therein.

The circuit board may further include an elastic body configured to bring the second temperature regulation member mounted to the second region into pressing contact with the second region.

The second temperature regulation member may include a temperature regulation plate having an insertion hole configured to insert a temperature sensor therein.

The board and the imager may be bonded by solder and resin.

The circuit board may further include a fixing member configured to fix the imager that is bonded to the first region to the first region.

According to an embodiment of the present technology, there is provided a circuit board, in which the hole is formed in the board, and the imager is bonded to the first region including one of at least the hole in the front surface of the board.

As described above, according to the present technology, the circuit board may have a compact structure without blocking the light receiving surface of the imager and is capable of efficiently regulating the temperature of the imager.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 4 are diagrams explaining bonding by resin;

FIG. 5 are diagrams explaining mounting of a heat sink;

DETAILED DESCRIPTION OF EMBODIMENTS

Hereinafter, an embodiment of the present disclosure will be described with reference to the drawings.

[Configuration Example of Microscope System]

Figure 1:
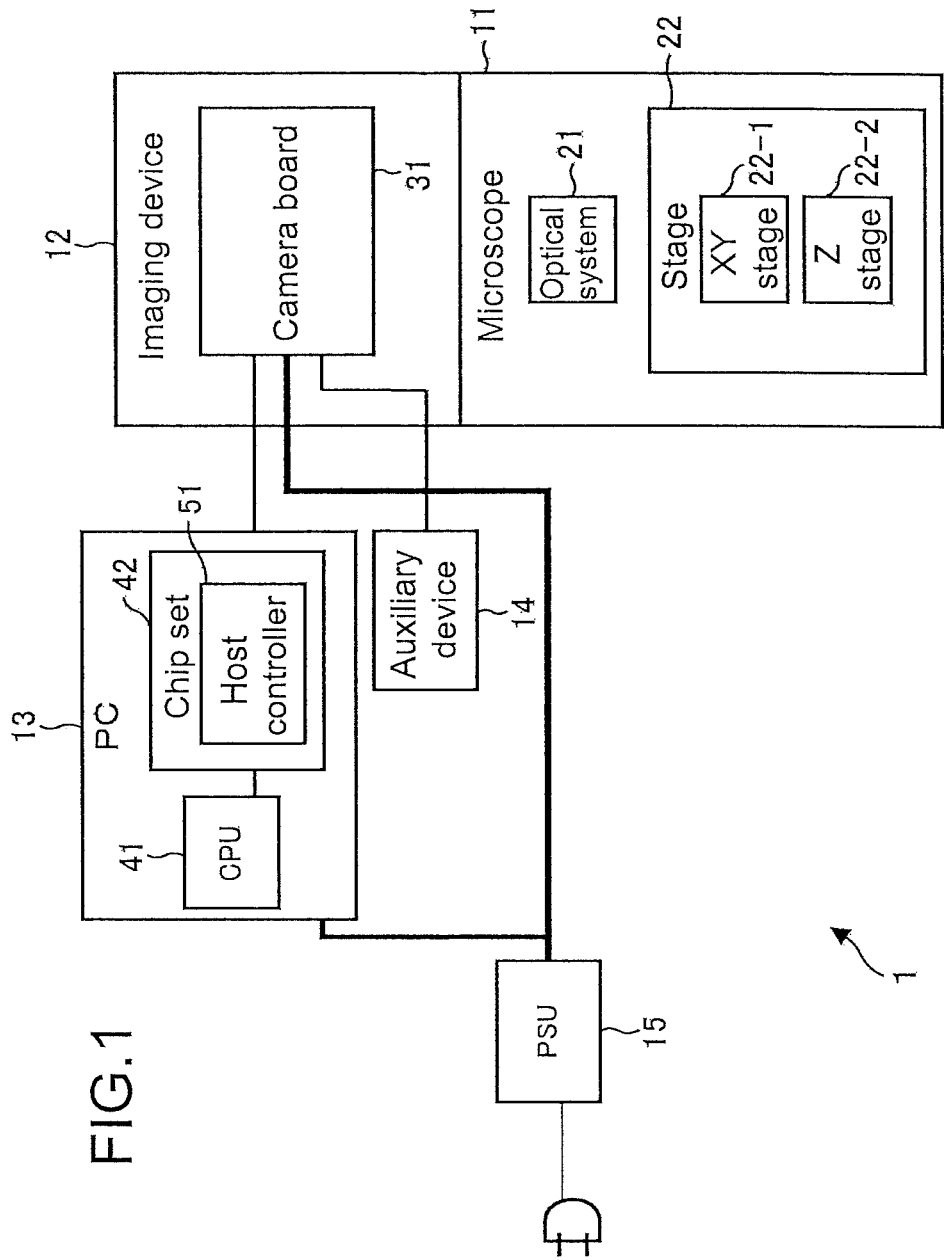
FIG. 1 is a diagram showing a configuration example of a microscope system.

FIG. 1 is a diagram showing a configuration example of a microscope system 1 according to an embodiment of the present technology.

The microscope system 1 is constituted of a microscope 11, an imaging device 12, a personal computer (PC) 13, an auxiliary device 14, a power supply unit (PSU) 15.

The microscope 11 includes an optical system 21 for forming a magnified image of a sample to be observed on a retina of an observer or on an image sensor of the imaging device 12, and a stage 22 on which the sample is placed, for example. The stage 22 is constituted of an XY stage 22-1 and a Z stage 22-2. The XY stage 22-1 is relatively moved parallel to an XY plane (for example, horizontal plane) with respect to the optical system 21 under control of a central processing unit (CPU) 41 of the PC 13 or according to an operation of a handle (not shown) performed by the observer. As a result, the sample placed on the stage 22 is also moved in parallel to the XY plane. Moreover, the Z stage 22-2 is relatively moved parallel to a Z-axis direction (for example, vertical direction) with respect to the optical system 21 under control of the CPU 41 of the PC 13 or according to the operation of the handle (not shown) performed by the observer. As a result, the sample placed on the stage 22 is also moved parallel to the Z-axis direction.

That is, the observer can visually recognize the magnified image of the sample placed on the stage 22 through the optical system 21. In this case, to focus the magnified image of the sample on the retina, the observer operates the PC 13 or the handle (not shown) to move the XY stage 22-1 and the Z stage 22-2, thereby moving a relative arrangement position of the sample with respect to the optical system 21 to an arbitrary position in a three-dimensional space.

Moreover, for example, when the imaging device 12 is mounted to the microscope 11, the imaging device 12 can image the magnified image of the sample placed on the stage 22 through the optical system 21.

The imaging device 12 includes a camera board 31 formed partly or mounted on the circuit board (a printed board 71 shown in FIG. 2) on which the imager (an imager 101 shown in FIG. 3) (described later) is mounted. The camera board 31 images the magnified image of the sample placed on the stage 22 under control of the PC 13 through the optical system 21. In this case, a signal which triggers various operations of the camera board 31 is supplied from the auxiliary device 14.

The PC 13 is constituted of the CPU 41 and a chip set 42. The CPU 41 controls an entire operation of the PC 13. The chip set 42 is constituted of chip groups executing various processing under control of the CPU 41 and includes a host controller 51 as one of such chips. The host controller 51 performs remote control of a device connected by a universal serial bus (USB). In this case, the host controller 51 performs remote control of the camera board 31 connected by the USB, thereby causing the camera board 31 to image the magnified image of the sample as described above.

The power supply unit (PSU) 15 supplies electric power to each unit constituting the microscope system 1 such as the PC 13 and the camera board 31.

[Overview of Present Technology]

Thus, the circuit board on which the imager is mounted is partly formed on the camera board 31 or mounted on the camera board 31. As described above, it is demanded that the imager be regulated to a constant temperature.

Therefore, the printed board according to an embodiment of the circuit board of the present technology conducts heat to a temperature regulation member such as a heat sink and a Peltier element and radiates the heat for regulating the temperature of the mounted imager constantly. In this case, in the circuit board according to the embodiment of the present technology, an opening is provided in a portion of a region on which the imager is mounted. It should be noted that a surface on which the imager is mounted in the printed board is referred to as a front surface, and a surface opposite to the front surface is referred to as a rear surface, as a matter of convenience for explanation. Therefore, the opening penetrates between the temperature regulation member arranged on the rear surface of the printed board and the imager mounted on the front surface of the printed board, so that the temperature regulation member can directly regulate a temperature with respect to the rear surface of the imager. Thus, since the temperature regulation member can directly regulate the temperature of the imager not through the printed board, it is possible to efficiently regulate the temperature. Therefore, it is not necessary to provide a fan and a thermostatic bath for regulating the temperature of the imager and it is possible to provide the circuit board which has a compact structure without blocking the light receiving surface of the imager and efficiently regulates the temperature of the imager.

[Schematic Configuration of Printed Board]

Figure 2A:
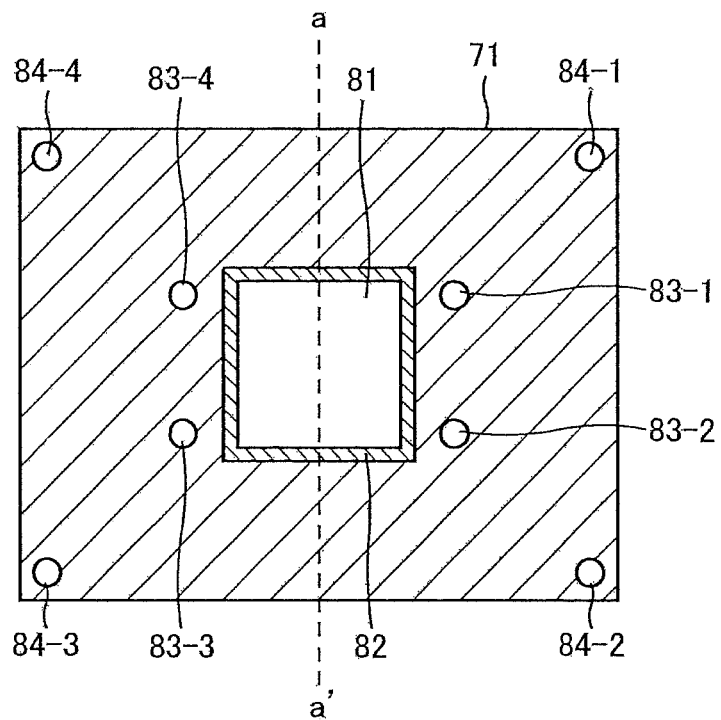
FIG. 2 are diagrams showing a schematic configuration of a printed board.
Figure 2B:
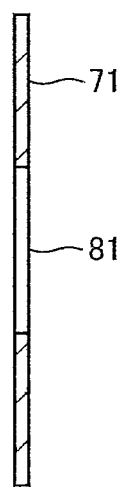

FIG. 2 are diagrams showing a schematic configuration of a printed board 71 according to an embodiment of the circuit board of the present technology. FIG. 2A is a top view of the printed board 71. FIG. 2B is a cross-sectional view of the printed board 71 along the line a-a' in FIG. 2A.

The printed board 71 includes a temperature regulating opening 81, an imager mounting pattern 82, imager fixing through holes 83-1 to 83-4, and printed board fixing through holes 84-1 to 84-4. It should be noted that in a case where the imager fixing through holes 83-1 to 83-4 do not need to be individually distinguished, these are referred to as the imager fixing through holes 83 collectively. Likewise, in a case where the printed board fixing through holes 84-1 to 84-4 do not need to be individually distinguished, these are referred to as the printed board fixing through holes 84 collectively.

The temperature regulating opening 81 is provided at a position for mounting an imager 101 described later using FIG. 3, and is made to be as large in area as possible, as far as the imager 101 (described later) can be bonded to the printed board 71.

The imager mounting pattern 82 is formed at an outer peripheral portion of the temperature regulating opening 81 in a front surface of the printed board 71. An imager mounting pattern 112 formed on the imager 101 (described later) is bonded to the imager mounting pattern 82 by solder, so that the imager 101 is mounted to the front surface of the printed board 71.

The imager fixing through holes 83 are provided adjacent a periphery of the imager mounting pattern 82 in the front surface of the printed board 71. The printed board fixing through holes 84 are provided at four corners of the front surface of the printed board 71. It should be noted that the application of the imager fixing through holes 83 and the printed board fixing through holes 84 will be described later.

[Schematic Configuration of Imager]

Figure 3A:
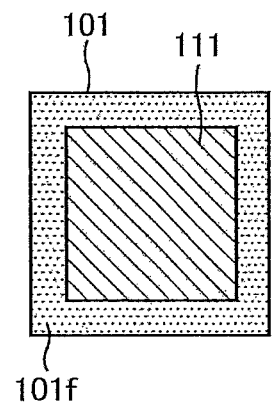
FIG. 3 are diagrams showing a schematic configuration of an imager.
Figure 3B:
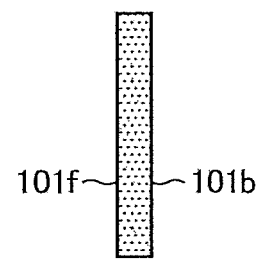
Figure 3C:
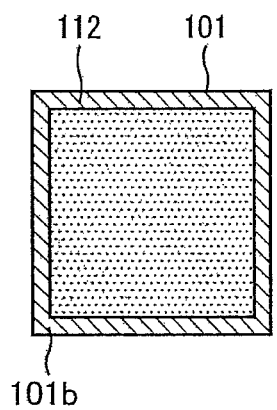

FIG. 3 are diagrams showing a schematic configuration of the imager 101. FIG. 3A is a top view of the imager 101. FIG. 3B is a side view of the imager 101. FIG. 3C is a bottom view of the imager 101.

As shown in FIG. 3A, a light receiving surface 111 is provided at the center of a surface 101f of the imager 101. It should be noted that the surface 101f of the imager 101 on which the light receiving surface 111 is provided is referred to as an imager front surface 101f. Moreover, a surface 101b opposite to the imager front surface 101f is referred to as an imager rear surface 101b.

As shown in FIG. 3C, the imager mounting pattern 112 is formed at an outer peripheral portion of the imager rear surface 101b. The imager mounting pattern 112 is bonded to the imager mounting pattern 82 (FIG. 2) of the printed board 71 by solder, so that the imager 101 is mounted on the front surface of the printed board 71. Therefore, the imager mounting pattern 82 of the printed board 71 has a dimension substantially the same as the imager mounting pattern 112 of the imager rear surface 101b. As a result, the imager 101 is bonded to a region including the temperature regulating opening 81 in the front surface of the printed board 71.

In this case, the imager mounting pattern 82 of the printed board 71 is bonded to the imager mounting pattern 112 of the imager rear surface 101b by solder, so that the printed board 71 is both mechanically and electrically bonded to the imager 101.

[Bonding by Resin]

Further, the printed board 71 and the imager 101 are bonded by resin for causing increase in strength of mechanical bonding between the printed board 71 and the imager 101.

FIG. 4 are diagrams explaining bonding between the printed board 71 and the imager 101 by resin. FIG. 4A is a top view of the printed board 71 on which the imager 101 is mounted. FIG. 4B is a cross-sectional view of the printed board 71 along the line a-a' in FIG. 4A.

As shown in FIG. 4, the imager 101 bonded by solder is mounted on the front surface of the printed board 71. Then, the printed board 71 and the imager 101 are bonded by a resin 131 shown at an outer peripheral portion of the imager 101. The imager 101 and the printed board 71 are bonded by solder, and further the bonding is reinforced by the resin 131, thereby increasing bonding strength.

[Mounting of Heat Sink]

Next, mounting of the heat sink as the temperature regulation member for regulating the temperature of the imager 101 constantly will be described.

FIG. 5 are diagrams explaining mounting of a heat sink 151. FIG. 5A is a top view of the printed board 71. FIG. 5B is a cross-sectional view of the printed board 71 along the line a-a' in FIG. 5A.

As shown in FIG. 5, the heat sink 151 is mounted on a rear surface of the printed board 71. The heat sink 151 includes a fixing projection 151-1 and a contacting projection 151-2. The fixing projection 151-1 is arranged at a position corresponding to the printed board fixing through holes 84 of the printed board 71. Moreover, the contacting projection 151-2 is arranged at a position corresponding to the temperature regulating opening 81 of the printed board 71.

A hole is provided at the center of the fixing projection 151-1 and screws (not shown) are screwed into the printed board fixing through holes 84 of the printed board 71 and the hole, so that the heat sink 151 is mounted on the rear surface of the printed board 71.

Moreover, the contacting projection 151-2 of the heat sink 151 is adhered to the imager rear surface 101b through an elastic thermal-conduction sheet 152 as the temperature regulation member. That is, the contacting projection 151-2 of the heat sink 151 is mounted to a region including the temperature regulating opening 81 in the rear surface of the printed board 71 through the thermal-conduction sheet 152. As a result, heat of the imager 101 is conducted to the contacting projection 151-2 through the thermal-conduction sheet 152 adhered to the imager rear surface 101b and the heat is radiated from the heat sink 151. It should be noted that thermal-conduction grease may be used instead of the elastic thermal-conduction sheet 152.

To uniformly regulate the temperature of the imager 101 from the imager rear surface 101b, the contacting projection 151-2 of the heat sink 151 adhered through the thermal-conduction sheet 152 and a contact area of the imager rear surface 101b are suitably as large as possible. Therefore, it may be necessary that a bonding area between the printed board 71 and the imager 101 be reduced as small as possible and an area of the temperature regulating opening 81 be increased. However, the bonding area between the printed board 71 and the imager 101 is reduced, which weakens the both bonding strength, so that the reinforcement of bonding by the resin 131 may be necessary.

Moreover, to improve thermal-conductivity from the imager 101 to the heat sink 151, it is suitable that the imager rear surface 101b is brought into pressing contact with the contacting projection 151-2 of the heat sink 151 through the elastic thermal-conduction sheet 152. To achieve this, it may be necessary that the imager 101 is strongly bonded to the printed board 71, and the reinforcement of bonding by the resin 131 may be necessary.

[Fixing by Imager Fixing Member]

Thus, strong bonding strength between the imager 101 and the printed board 71 may be necessary to efficiently regulate the temperature of the imager. Therefore, to increase further the bonding strength between the imager 101 and the printed board 71, in addition to the reinforcement of bonding by the resin 131, the imager 101 is also fixed to the printed board 71 by a fixing member.

Figure 6:
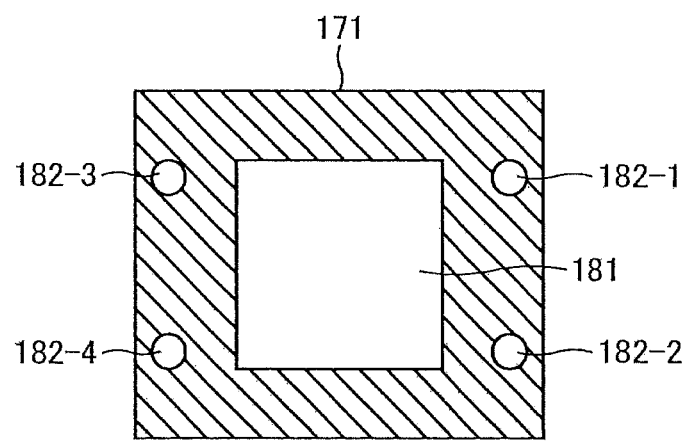
FIG. 6 is a diagram showing a schematic configuration of an imager fixing member.

FIG. 6 is a diagram showing a schematic configuration of an imager fixing member 171.

The imager fixing member 171 includes an opening 181, and imager fixing member through holes 182-1 to 182-4. It should be noted that in a case where the imager fixing member through holes 182-1 to 182-4 do not need to be individually distinguished, these are referred to as the imager fixing member through holes 182 collectively.

The opening 181 is formed at the center of the imager fixing member 171 and is configured larger than an area of the light receiving surface 111 so as not to block light to the light receiving surface 111 of the imager 101.

The imager fixing member through holes 182 are provided adjacent a periphery of the opening 181 of the imager fixing member 171. Screws (not shown) are screwed into the imager fixing member through holes 182 and the imager fixing through holes 83 of the printed board 71, so that the imager fixing member 171 is mounted to the printed board 71.

Figure 7A:
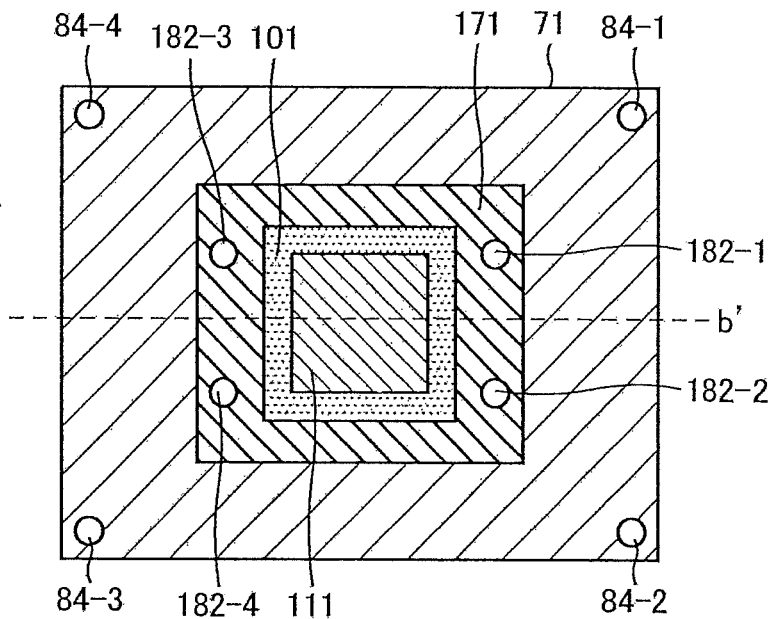
FIG. 7 are diagrams explaining mounting of the imager fixing member.
Figure 7B:
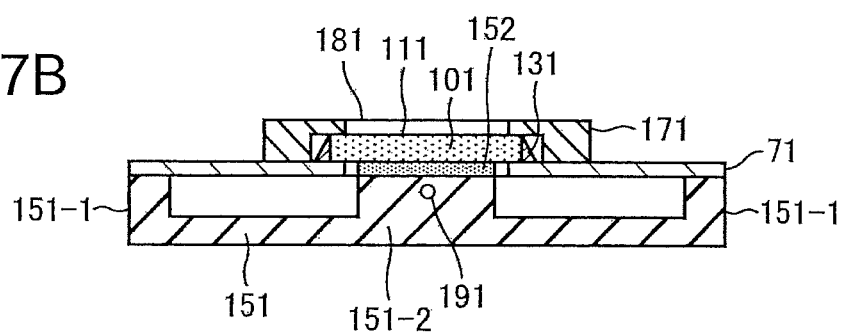

FIG. 7 are diagrams explaining mounting of the imager fixing member 171. FIG. 7A is a top view of the printed board 71 on which the imager fixing member 171 is mounted. FIG. 7B is a cross-sectional view of the printed board 71 along the line b-b' in FIG. 7A.

As shown in FIG. 7, the imager fixing member 171 is mounted on a front surface of the printed board 71 on which the imager 101 is mounted. The imager fixing member 171 is stacked on the imager front surface 101f and is mounted to the printed board 71 by screws (not shown) while the imager fixing member 171 and the printed board 71 hold the imager 101 therebetween. As a result, bonding between the printed board 71 and the imager 101 by solder is reinforced by the resin 131 and the imager fixing member 171, thereby increasing bonding strength.

As shown in FIG. 7B, a temperature sensor inserting hole 191 is provided in the contacting projection 151-2 of the heat sink 151 mounted on the rear surface of the printed board 71. A temperature sensor (not shown) such as a thermocouple and a thermistor is inserted into the temperature sensor inserting hole 191 and the temperature of the imager 101 is measured by the temperature sensor. Therefore, the temperature sensor inserting hole 191 is provided to a position nearest the imager 101 in the contacting projection 151-2 so as to accurately measure the temperature of the imager 101 by the temperature sensor.

The temperature of the imager 101 is measured by the temperature sensor, so that it is possible to check whether or not the temperature of the imager 101 is within a proper range.

As described above, the heat of the imager 101 is conducted to the contacting projection 151-2 of the heat sink 151 through the thermal-conduction sheet 152 adhered to the imager rear surface 101b. Therefore, it may be necessary that the heat conducted from the contacting projection 151-2 to the heat sink 151 be not conducted again to the imager 101 through the printed board 71 from the fixing projection 151-1. Therefore, the fixing projection 151-1 of the heat sink 151 is constituted of a material which does not conduct heat.

[Other Schematic Configurations of Printed Board]

Next, a schematic configuration of the printed board 71 for regulating the imager 101 at a desired temperature will be described.

Figure 8A:
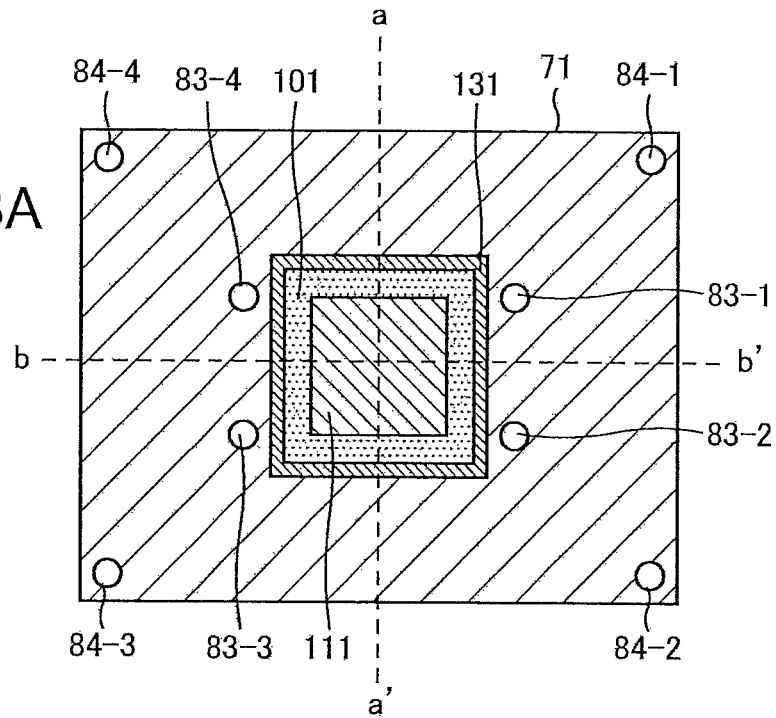
FIG. 8 are diagrams showing another schematic configuration of the printed board.
Figure 8B:
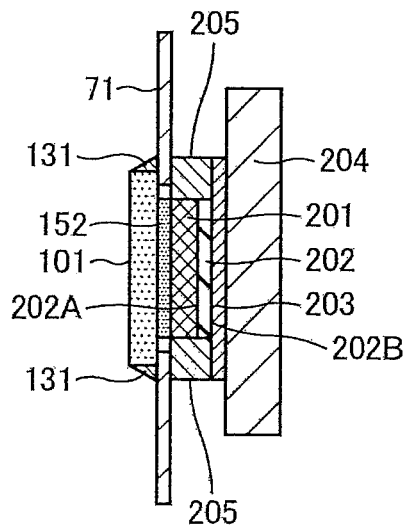

FIG. 8 are diagrams showing the schematic configuration of the printed board 71 for regulating the imager 101 at a desired temperature. FIG. 8A is a top view of the printed board 71 on which the imager 101 is mounted. FIG. 8B is a cross-sectional view of the printed board 71 along the line a-a' in FIG. 8A.

As shown in FIG. 8A, the imager 101 bonded by solder is mounted on the front surface of the printed board 71. Then, the bonding between the printed board 71 and the imager 101 is reinforced by the resin 131 at an outer peripheral portion of the imager 101.

As shown in FIG. 8B, a temperature regulation plate 201, a Peltier element 202, a plate spring 203, and a heat sink 204 are stacked in the stated order on the rear surface of the printed board 71.

The temperature regulation plate 201 as the temperature regulation member is constituted of a material having high thermal conductivity such as copper and aluminum and is provided with a temperature sensor inserting hole 231 for inserting the temperature sensor therein. The temperature regulation plate 201 is adhered on the imager rear surface 101b through the thermal-conduction sheet 152.

The Peltier element 202 as the temperature regulation member is adhered to the temperature regulation plate 201 by a heat conductive adhesive, silver paste, and the like. A surface adhered to the temperature regulation plate 201 of the Peltier element 202 is referred to as a surface 202A, and a surface on which the plate spring 203 on the opposite side is mounted is referred to as a surface 202B. When the Peltier element 202 is energized, one of the board surfaces becomes a heat-absorbing surface and the other becomes a heat-generating surface.

When the surface 202A is the heat-absorbing surface, the surface 202B on the opposite side is the heat-generating surface. That is, when a predetermined positive voltage value is applied to the Peltier element 202, a temperature difference $\Delta T$ corresponding to the positive voltage value occurs between the surface 202A and the surface 202B. As a result, the heat radiated by the imager 101 is absorbed by the surface 202A, with the result that the imager 101 is cooled.

Moreover, when the surface 202A is the heat-generating surface, the surface 202B on the opposite side is the heat-absorbing surface. That is, when the predetermined positive voltage value is applied to the Peltier element 202, the temperature difference $\Delta T$ corresponding to the positive voltage value occurs between the surface 202A and the surface 202B. As a result, heat generation of the surface 202A is transferred to the imager 101 and the imager 101 is heated.

Thus, the imager 101 is heated or cooled by the Peltier element 202 and can be regulated to a predetermined temperature.

The plate spring 203 is installed between the Peltier element 202 and the heat sink 204, and brings the thermal-conduction sheet 152, the temperature regulation plate 201, the Peltier element 202, and the heat sink 204 into pressing contact with the rear surface of the printed board 71. A unit for regulating the temperature of the imager 101 which is constituted of one or more temperature regulation members such as the thermal-conduction sheet 152, the temperature regulation plate 201, the Peltier element 202, and the heat sink 204 is referred to as a temperature regulation unit.

[Schematic Configuration of Plate Spring]

Figure 9:
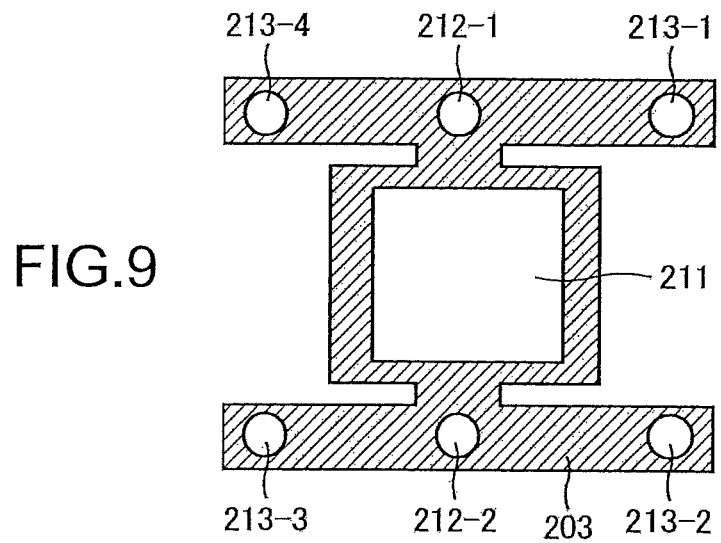
FIG. 9 is a diagram showing a schematic configuration of a plate spring.

FIG. 9 is a diagram showing a schematic configuration of the plate spring 203.

The plate spring 203 includes an opening 211, heat sink attaching holes 212-1 and 212-2, and temperature regulation unit attaching holes 213-1 to 213-4. It should be noted that in a case where the heat sink attaching holes 212-1 and 212-2 do not need to be individually distinguished, these are referred to as the heat sink attaching holes 212 collectively. Likewise, in a case where the temperature regulation unit attaching holes 213-1 to 213-4 do not need to be individually distinguished, these are referred to as the temperature regulation unit attaching holes 213 collectively.

First, the plate spring 203 is mounted to the heat sink 204 by screwing screws (not shown) into the heat sink attaching holes 212. Then, the screws (not shown) are screwed into the temperature regulation unit attaching holes 213 of the plate spring 203, a spacer 205, and the imager fixing through holes 83 of the printed board 71, so that the temperature regulation unit as the temperature regulation member is brought into pressing contact with an region including the temperature regulating opening 81 in the rear surface of the printed board 71.

Since the opening 211 is provided in the plate spring 203, the surface 202B of the Peltier element 202 is brought into contact with the heat sink 204, and thermal conduction is allowed between the surface 202B and the heat sink 204.

Also in the printed board 71 in FIG. 8, to uniformly regulate the temperature of the imager 101 from the imager rear surface 101b, the temperature regulation plate 201 bonded through the thermal-conduction sheet 152 and the contact area of the imager rear surface 101b are suitably as large as possible. Therefore, it may be necessary that the bonding area between the printed board 71 and the imager 101 be reduced as small as possible and the area of the temperature regulating opening 81 be increased. However, the bonding area between the printed board 71 and the imager 101 is reduced, which weakens the both bonding strength, so that the reinforcement of bonding may be necessary.

Moreover, to improve thermal-conductivity from the imager 101 to the temperature regulation unit, it is suitable that the imager rear surface 101b is brought into pressing contact with the temperature regulation unit through the elastic thermal-conduction sheet 152. To achieve this, it may be necessary that the imager 101 is strongly bonded to the printed board 71, and the reinforcement of bonding may be necessary.

Therefore, to increase further the mechanical bonding strength between the printed board 71 and the imager 101, in addition to the reinforcement of bonding by the resin 131, the bonding is reinforced by the imager fixing member 171 in FIG. 6, which causes further increase in the bonding strength between the printed board 71 and the imager 101.

The top view of a case where the imager fixing member 171 is mounted to the printed board 71 in FIG. 8 is the same as that of FIG. 7A. However, a cross-sectional view along the line b-b' of the printed board 71 in FIG. 8A on which the imager fixing member 171 is mounted is as shown in FIG. 10.

[Schematic Configuration of Printed Board when Imager Fixing Member is Mounted]

Figure 10:
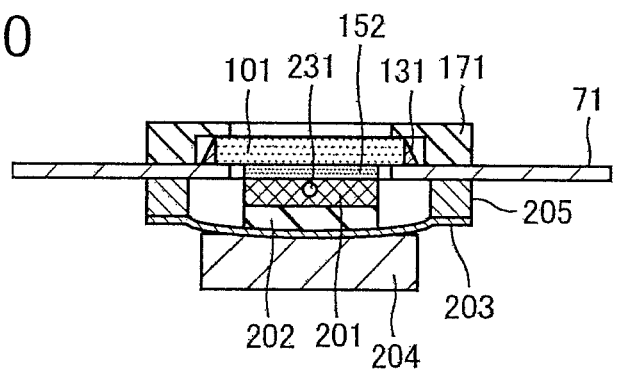
FIG. 10 is a cross-sectional view of another schematic configuration of the printed board.

FIG. 10 is a cross-sectional view of a schematic configuration in a case where the imager fixing member 171 is mounted to the printed board 71 in FIG. 8.

As shown in FIG. 10, screws (not shown) are screwed into the imager fixing member through holes 182 of the imager fixing member 171, the imager fixing through holes 83 of the printed board 71, the spacer 205, and the temperature regulation unit attaching holes 213 of the plate spring 203, so that these components are fixed. That is, the imager 101 is fixed on the front surface of the printed board 71 by the imager fixing member 171 and the temperature regulation unit is fixed on the rear surface of the printed board 71 by the plate spring 203.

A temperature sensor (not shown) such as a thermocouple and a thermistor is inserted into the temperature sensor inserting hole 231 provided in the temperature regulation plate 201 and the temperature of the imager 101 is measured by the temperature sensor. The temperature sensor inserting hole 231 is provided to a position nearest the imager 101 in the temperature regulation plate 201 so as to accurately measure the temperature of the imager 101 by the temperature sensor.

A predetermined positive voltage value is determined as a command voltage to the Peltier element 202 on the basis of the temperature of the imager 101 measured by the temperature sensor. Then, the temperature difference ΔT of the Peltier element 202 is changed by applying the command voltage to the Peltier element 202, consequently allowing for regulating the imager 101 at a desired temperature.

Thus, the temperature regulating opening 81 is provided to the printed board 71, so that the temperature regulation member such as the heat sink 151 and the Peltier element 202 can directly regulate the temperature of the imager rear surface 101b not through the printed board 71. That is, since the temperature regulation member can directly regulate the temperature of the imager 101 not through the printed board 71, it is not necessary to provide the fan and the thermostatic bath and it is possible to provide the circuit board which has a compact structure without blocking the light receiving surface 111 of the imager 101 and efficiently regulates the temperature.

Moreover, according to the present technology, the elastic thermal-conduction sheet 152 is provided between the imager 101 and the temperature regulation member such as the heat sink 151 and the Peltier element 202, and the temperature regulation unit is fixed on the rear surface of the printed board 71 by the elastic plate spring 203. Therefore, it is possible to allow stable thermal connection between the imager 101 and the temperature regulation member even without needing precision of a mechanical press-contact height.

Embodiments of the present technology are not limited to the embodiments described hereinabove, but variable alterations and modifications can be made without departing from the spirit and scope of the present technology.

In the above described examples, the temperature regulation member such as the heat sink 151 and the Peltier element 202 is arranged on the rear surface of the printed board 71. However, the temperature regulation member is not a main element, but the effect of regulating the temperature of the imager 101 can be obtained by providing the temperature regulating opening 81 on the printed board 71. Moreover, since the imager 101 can be evenly cooled from the imager rear surface 101b by arranging the fan and the like on the rear surface of the printed board 71, the effect of regulating the temperature can be obtained without blocking the light receiving surface 111 of the imager 101.

Moreover, the above examples describe that the printed board 71 is partly formed or mounted on the camera board 31 of the imaging device 12 which is a component of the microscope system 1. However, the printed board 71 is not limited to this. The printed board 71 of the embodiment of the present technology can be applied widely to a circuit board which mounts components necessary for regulating a temperature.

It should be noted that the present technology can be configured as follows.

(1) A circuit board, including: a board having a hole formed therein; and an imager that is bonded to a first region including at least a portion of the hole in a front surface of the board.

(2) The circuit board according to Item (1), further including: a first temperature regulation member; and a second temperature regulation member, in which one of the first temperature regulation member and the second temperature regulation member is mounted in a second region including at least a portion of the hole in a rear surface of the board.

(3) The circuit board according to Item (1) or (2), further including a third temperature regulation member inserted between a rear surface of the imager and one of the first temperature regulation member and the second temperature regulation member.

(4) The circuit board according to Item (1), (2), or (3) in which the third temperature regulation member includes an elastic thermal conductor sheet.

(5) The circuit board according to any one of Items (1) to (4), in which the third temperature regulation member includes thermal-conduction grease.

(6) The circuit board according to any one of Items (1) to (5), in which the first temperature regulation member is a heat sink including an insertion hole configured to insert a temperature sensor therein.

(7) The circuit board according to any one of Items (1) to (6), further including an elastic body configured to bring the second temperature regulation member mounted to the second region into pressing contact with the second region.

(8) The circuit board according to any one of Items (1) to (7), in which the second temperature regulation member includes a temperature regulation plate having an insertion hole configured to insert a temperature sensor therein.

(9) The circuit board according to any one of Items (1) to (8), in which the board and the imager are bonded by solder and resin.

(10) The circuit board according to any one of Items (1) to (9), further including a fixing member configured to fix the imager that is bonded to the first region to the first region.

The present technology can be applied to a circuit board which mounts the imager.

The present disclosure contains subject matter related to that disclosed in Japanese Priority Patent Application JP 2011-196819 filed in the Japan Patent Office on Sep. 9, 2011, the entire content of which is hereby incorporated by reference.

What is claimed is:

1. A circuit board apparatus, comprising:
a circuit board having a hole formed therein; and
an imager that is adhered directly to a first region including at least a portion of the hole in a front surface of the circuit board,
a first temperature regulation member;
a second temperature regulation member;
a third temperature regulation member inserted between a rear surface of the imager and one of the first temperature regulation member and the second temperature regulation member,
wherein the first region includes a first region segment of the circuit board and the first region segment is contiguous to the at least portion of the hole in the front surface of the circuit board, and
one of the first temperature regulation member and the second temperature regulation member is mounted in a second region including at least a portion of the hole in a rear surface of the circuit board.

2. The circuit board apparatus according to claim 1, wherein
the third temperature regulation member includes an elastic thermal conductor sheet.

3. The circuit board apparatus according to claim 1, wherein
the third temperature regulation member includes thermal-conduction grease.

4. The circuit board apparatus according to claim 2, wherein
the first temperature regulation member is a heat sink including an insertion hole sized to insert a temperature sensor therein.

5. The circuit board apparatus according to claim 2, further comprising
an elastic body to bring the second temperature regulation member mounted to the second region into pressing contact with the second region.

6. The circuit board apparatus according to claim 5, wherein
the second temperature regulation member includes a temperature regulation plate having an insertion hole sized to insert a temperature sensor therein.

7. The circuit board apparatus according to claim 2, wherein
the circuit board and the imager are bonded by solder and resin.

8. The circuit board apparatus according to claim 7, further comprising
a fixing member to fix the imager that is bonded to the first region to the first region.

9. A circuit board, comprising:
a board having a hole formed therein;
an imager that is bonded to a first region including at least a portion of the hole in a front surface of the board;
a first temperature regulation member;
a second temperature regulation member; and
a third temperature regulation member inserted between a rear surface of the imager and one of the first temperature regulation member and the second temperature regulation member,
wherein one of the first temperature regulation member and the second temperature regulation member is mounted in a second region including at least a portion of the hole in a rear surface of the board,
wherein the third temperature regulation member includes an elastic thermal conductor sheet and
wherein the first temperature regulation member is a heat sink including an insertion hole sized to insert a temperature sensor therein.

10. A circuit board, comprising:
a board having a hole formed therein;
an imager that is bonded to a first region including at least a portion of the hole in a front surface of the board;
a first temperature regulation member;
a second temperature regulation member;
a third temperature regulation member inserted between a rear surface of the imager and one of the first temperature regulation member and the second temperature regulation member; and
an elastic body to bring the second temperature regulation member mounted to the second region into pressing contact with the second region,
wherein one of the first temperature regulation member and the second temperature regulation member is mounted in a second region including at least a portion of the hole in a rear surface of the board,
wherein the third temperature regulation member includes an elastic thermal conductor sheet and
wherein the second temperature regulation member includes a temperature regulation plate having an insertion hole sized to insert a temperature sensor therein.

11. A circuit board, comprising:
a board having a hole formed therein;
an imager that is bonded to a first region including at least a portion of the hole in a front surface of the board;
a first temperature regulation member;
a second temperature regulation member; and
a third temperature regulation member inserted between a rear surface of the imager and one of the first temperature regulation member and the second temperature regulation member,
wherein one of the first temperature regulation member and the second temperature regulation member is mounted in a second region including at least a portion of the hole in a rear surface of the board,
wherein the third temperature regulation member includes an elastic thermal conductor sheet and
wherein the board and the imager are bonded by solder and resin.

12. The circuit board according to claim 11, further comprising
a fixing member to fix the imager that is bonded to the first region to the first region.

13. The circuit board apparatus according to claim 1, wherein
the first region segment of the circuit board is adhered directly to a bonding portion of the imager by a bonding material, the first region segment and the bonding portion of the imager being facially opposed to each other with the bonding material disposed therebetween.

* * * * *